United States Patent

Kawano et al.

[11] Patent Number: 6,159,642
[45] Date of Patent: *Dec. 12, 2000

[54] EXPOSURE MASK AND METHOD OF MANUFACTURING THEREOF, AND PATTERN DATA GENERATING METHOD FOR AN EXPOSURE MASK

[75] Inventors: Kenji Kawano, Tokyo; Shinichi Ito, Yokohama; Satoshi Tanaka, Kawasaki; Soichi Inoue; Hideki Kanai, both of Yokohama; Ikuo Yoneda, Kawasaki, all of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/813,049

[22] Filed: Mar. 7, 1997

[30] Foreign Application Priority Data

Mar. 8, 1996 [JP] Japan ...................................... 8-052021

[51] Int. Cl.$^7$ ........................................................ G03F 9/00
[52] U.S. Cl. ...................................................... 430/5; 216/12
[58] Field of Search .................................... 430/5; 216/12

[56] References Cited

U.S. PATENT DOCUMENTS

| | | | |
|---|---|---|---|
| 5,348,826 | 9/1994 | Dao et al. | 430/5 |
| 5,465,859 | 11/1995 | Chapple-Sokol et al. | 216/12 |
| 5,549,995 | 8/1996 | Tanaka et al. | 430/5 |

*Primary Examiner*—Mark Chapman
*Attorney, Agent, or Firm*—Oblon, Spivak, McClelland, Maier & Neustadt, P.C.

[57] ABSTRACT

An exposure mask includes a transparent substrate having a light shielding pattern and an aperture pattern thereon for transmitting an exposure light and arranged in that any two adjacent apertures of the same pattern size in the aperture pattern are different from each other in the etched depth, wherein a difference between the aperture pattern size and its adjacent light shielding pattern size, and the trench depth in the aperture pattern are determined by a sum of the aperture pattern size and its adjacent light shielding pattern size.

17 Claims, 5 Drawing Sheets

FIG. 9E

EXPOSURE MASK AND METHOD OF MANUFACTURING THEREOF, AND PATTERN DATA GENERATING METHOD FOR AN EXPOSURE MASK

BACKGROUND OF THE INVENTION

1. Field of the Invention

The present invention relates to an exposure mask for use in a lithography process of a semiconductor manufacturing machine, a method of manufacturing the same, and a pattern data generating method thereof.

2. Discussion of the Background

It has been requested that semiconductor integrated circuits are increased in density and decreased in size. Such a demand is responded by minimizing the wavelength of an exposure light source. On the other hand, a phase shifting technique has been focused using modifications of an exposure mask without changing characteristics of the exposure light source. The phase shifting technique employs a part, called a phase shifter, for inverting the phase. Accordingly, the accuracy of a mask pattern will be increased since positive interference of light from the neighbor pattern is eliminated.

Among a plurality of variations of the phase shifting technique which have been proposed is a method developed by D. Levenson et al (and stipulated in IEEE Trans., In Electron Devices, Vol. ED-29, No.12 (1982), p1828) in which both the resolution and the depth of focus (DOF) are increased considerably. The Levenson method designates the phase difference between two lights transmitted through two adjacent regions of an exposure mask to 180 degrees for producing a negative interference, hence improving the resolution of a periodic pattern such as a line and space (L&S) pattern.

The (Levenson) masks according to the Levenson method are classified into a (on-shifter) type in which a phase inverting layer (called a phase shifter) is placed on a substrate, and a (trench) type where a transparent substrate is etched for generating the phase difference.

The on-shifter type mask has a phase shifter produced after the pattern of light shielding portions is formed, thus allowing the light shielding portions and boundary regions to be increased in thickness and failing to have a uniform thickness of the aperture portions. Also, the phase shifter is not identical in complex index of refraction to the transparent substrate, whereby the intensity of light transmitted through the phase shifter will be smaller than that of non-shifter portions and the pattern of a resist will be varied in size when having been printed.

The trench type mask is fabricated by a simpler manner than the on-shifter type mask. However, when the trenches are formed by anisotropic etching, it permits a smaller amount of light to be transmitted due to the effect of its wall as compared with across the non-trench portions. As the result, there is created a difference of size in the resist pattern between the trench and the non-trench portion.

This may be corrected by Citation 1 ("Pattern-dependent correction of mask topography effects for alternating phase-shifting masks" by R. A. Ferguson et al, Proc. SPIE, Vol. 2440, 1995: hereinafter called as first prior art) where the size of an aperture corresponding to the shifter in a Levenson mask of which shifter portions only are trenched is greater than that of the non-shifter portions to optimize the transmission of the aperture.

Also, the size difference of the resist pattern may be minimized by having 180 degree of the phase difference between the shifter and the non-shifter portion which are trenched 360 degrees and 180 degrees respectively, as disclosed in Citation 2 ("Exposure characteristics of alternate aperture phase-shifting masks fabricated using subtractive process" by R. L. Kostelak et al, J. Vac. Sci. Technol. B10(6), November/December 1992: hereinafter called as a second prior art).

Figure 1:
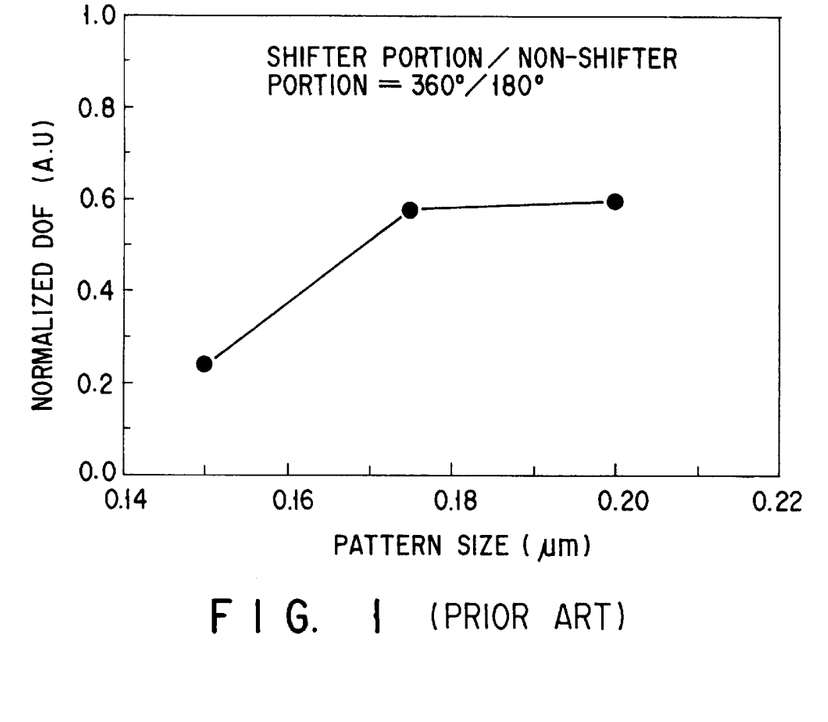
FIG. 1 is a diagram showing a variation of DOF in proportion to the pattern size with the use of a conventional Levenson mask.

However, those conventional methods have some drawbacks. It is essential in the first prior art to have each phase difference dependent aperture compensated with a bias corresponding to a predetermined value of the phase difference during designing or when design data is converted into mask plotting data. This will require large amounts of labor and time. The second prior art hardly produces an ideal DOF even if the trench depth is optimized as apparent from FIG. 1. It should be noted that the normalized DOF shown in FIG. 1 is a relative value of DOF of the mask with the non-shifter and the shifter portion trenched 180 degrees and 360 degrees respectively to the DOF of an ideal mask having no effect of mask topography.

As apparent, the conventional trench type Levenson mask is advantageous over the on-shift type in the ease of fabrication but produces a unwanted size difference of the resist pattern between the trench and the non-trench portion. For compensation, the first prior art allows the aperture size of the shifter portion to be greater than that of the non-shifter portion for controlling the transmission of each aperture. This will require large amounts of labor and time. The second prior art is intended to minimize the effect of side walls by having a phase difference of 180 degrees between the non-shifter and the shifter portion which are trenched 180 degrees and 360 degrees respectively. It however fails to gain an ideal value of DOF even though the trench depth is optimized.

BRIEF SUMMARY OF THE INVENTION

It is an object of the present invention to provide an exposure mask and a method of manufacturing the same which is capable of printing a pattern at high accuracy while preventing the generation of any size variation on a resist pattern which results from a 3-dimensional structure of the mask, and more particularly, an exposure mask and a method of manufacturing the same which minimizes a size variation on a resist pattern caused by the wall of aperture trenches and is fabricated with much ease.

For achieving the above object of the present invention, the following features are provided.

An exposure mask according to the present invention is characterized by comprising: a transparent substrate having a light shielding pattern and an aperture pattern thereon for transmitting an exposure light and arranged in that any two adjacent apertures of the same pattern size in the aperture pattern are different from each other in the etched depth, wherein a difference between the aperture pattern size and its adjacent light shielding pattern size, and the trench depth in the aperture pattern are determined by a sum of the aperture pattern size and its adjacent light shielding pattern size.

Another exposure mask according to the present invention is characterized in that a difference between the aperture pattern size and its adjacent light shielding pattern size are determined by the trench depth in the aperture pattern, and a sum of the aperture pattern size and its adjacent light shielding pattern size. A further exposure mask according to the present invention is characterized in that the trench depth in the aperture pattern is determined by a difference between the aperture pattern size and its adjacent light shielding pattern size, and a sum of the aperture pattern size and its adjacent light shielding pattern size.

Preferred manners of the exposure masks of the present invention are stipulated as follows:

(1) At least one of the depth of a deep trench in the aperture pattern and a difference between the depth between the deep trench and a shallow trench in the aperture pattern is determined by the aperture pattern size.

(2) At least one of the depth of a deep trench in the aperture pattern and a difference between the depth between the deep trench and a shallow trench in the aperture pattern is determined by a ratio of the aperture pattern size to the sum of the aperture pattern size and its adjacent light shielding pattern size.

(3) The depth $D_1$ of the deep trench and the depth $D_2$ of the shallow trench in the aperture pattern are expressed by:

$$|D_1-D_2|=m_1\lambda/(2n-1)-\delta 1,$$

$$9\lambda/16(n-1)+m_2\lambda/(n-1) \leq D_1,$$

$$D_1 \leq \lambda/(n-1)+m_2\lambda/(n-1), \text{ and}$$

$$|\delta_1|<\lambda/16(n-1)$$

where n is the index of refraction of the transparent substrate, $\lambda$ is the wavelength of exposure light, and $m_1$ and $m_2$ are integers equal to or greater than 1).

(4) A edge of the light shielding pattern corresponds substantially to a edge of the transparent substrate.

(5) The difference and the trench depth are determined by a coherence factor in the exposing, a complex index of refraction of the substrate at the wavelength of exposure light, and a complex index of refraction of the light shielding pattern at the wavelength of exposure light in addition to the sum of the aperture pattern size and its adjacent light shielding pattern size.

It is now noted that the coherence factor a and the complex index of refraction of a substrate or a light shielding pattern layer are also parameters for determining a sum of the aperture pattern size and the light shielding pattern size as well as a difference between the same and the depth of an etched trench in the aperture pattern. The more the parameters are concerned, the higher the size and depth will be calculated in accuracy.

According to the present invention, an exposure masks is provided comprising a transparent substrate having a light shielding pattern and an aperture pattern thereon for transmitting an exposure light and arranged in that any two adjacent apertures of the same pattern size in the aperture pattern are different from each other in the etched depth. In particular, both the ratio of the aperture pattern size to a sum of the aperture pattern size and its adjacent light shielding pattern size and the depth of the trench in the aperture pattern are determined by the sum of the aperture pattern size and its adjacent light shielding pattern size.

Also, the depth of the trench in the aperture pattern may be determined by the ratio of the aperture pattern size to the sum of the aperture pattern size and its adjacent light shielding pattern size and the sum of the aperture pattern size and its adjacent light shielding pattern size. It is possible to determine the ratio of the aperture pattern size to the sum of the aperture pattern size and its adjacent light shielding pattern size from the depth of the trench in the aperture pattern and the sum of the aperture pattern size and its adjacent light shielding pattern size.

A method of manufacturing an exposure mask according to the present invention is characterized by comprising: a first step of forming a light shielding pattern and an aperture pattern defining apertures on a transparent substrate for transmitting an exposure light; a second step of measuring at least one of the aperture pattern and the light shielding pattern; a third step of determining the depth of a trench in the aperture pattern in relation to the size measured in the second step; and a fourth step of etching the aperture pattern in the transparent substrate to have the trenches of the determined depth.

Preferred manners of the method of the present invention are stipulated as follows:

(1) The second step includes measuring at least one of the aperture pattern and the light shielding pattern with an optical or electron-beam means.

(2) The third step includes calculating the trench depth so that the focal points of images of their respective apertures are substantially identical in a simulation concerning the effect of mask topography.

(3) The third step includes calculating the trench depth so that the intensities of illumination of images of their respective apertures at the focal point are substantially identical in a simulation concerning the effect of mask topography.

(4) The fourth step includes forming the trenches by anisotropic etching. The anisotropic etching is implemented by a reactive ion etching (RIE).

A method of generating a pattern data for an exposure mask which incorporates a transparent substrate having a light shielding pattern and an aperture pattern thereon for transmitting an exposure light and arranged in that any two adjacent apertures of the same pattern size in the aperture pattern are different from each other in the depth of an aperture trench, according to the present invention is characterized by comprising: a first step of setting the trench depth to a desired value; and a second step of determining the ratio of the aperture pattern size to a sum of the aperture pattern size and its adjacent light shielding pattern size in accordance with the desired value of the etched depth.

Preferred manners of the method are stipulated as follows:

(1) The second step includes calculating the ratio of the aperture pattern size to the sum of the aperture pattern size and its adjacent light shielding pattern size so that the focal points of images of their respective apertures are substantially identical in a simulation concerning the effect of mask topography.

(2) The second step includes calculating the ratio of the aperture pattern size to the sum of the aperture pattern size and its adjacent light shielding pattern size so that the intensities of illumination of images of their respective apertures at the focal point, are substantially identical in a simulation concerning the effect of mask topography.

(3) The second step is performed when a mask pattern is being designed or a design data is converted into a plotting data.

(4) The trench is shaped of a rectangular configuration.

Figure 2A:
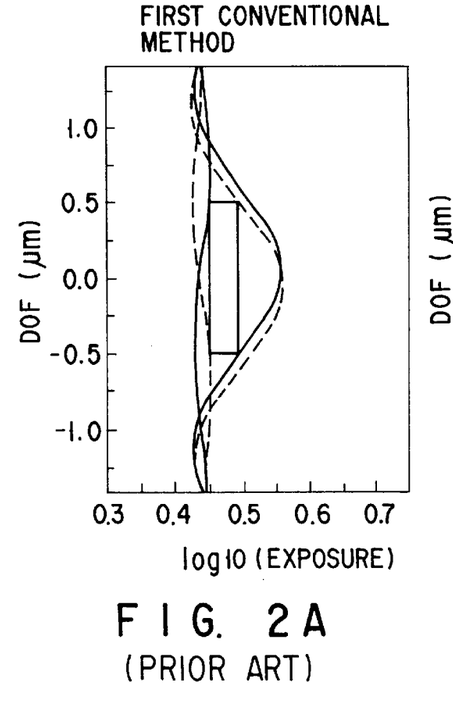
FIGS. 2A to 2C are diagrams showing comparison in the ED-tree of the Levenson mask between the present invention and two prior arts.
Figure 2B:
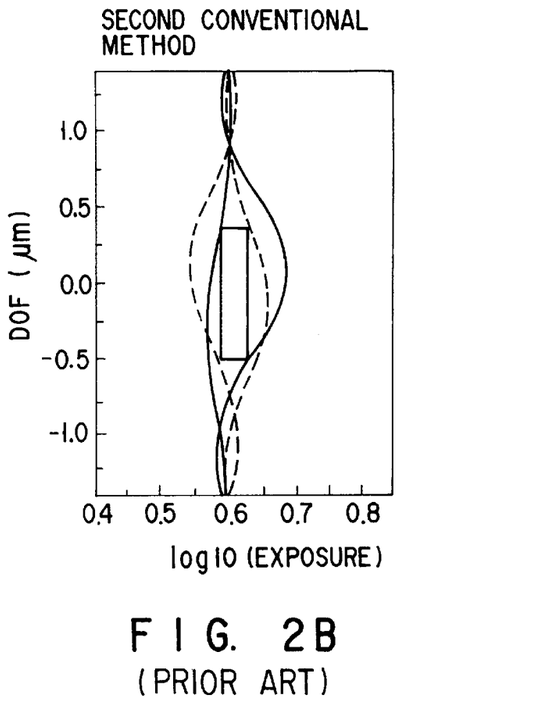
Figure 2C:
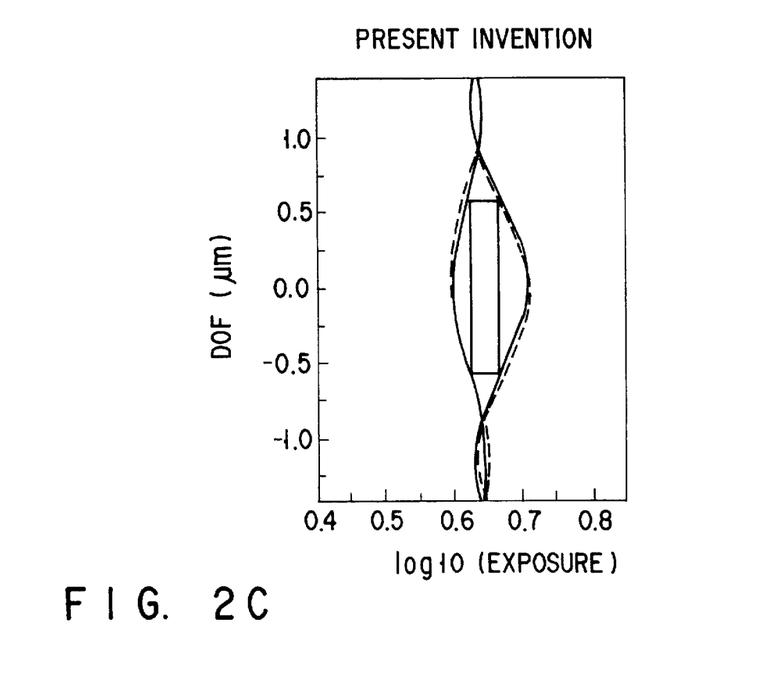

FIGS. 2A to 2C are ED (exposure defocus) diagrams of a 0.15 $\mu$m L&S pattern with exposure light of 248 nm (the reduction rate being ¼) showing comparison of the present invention with the prior arts. In the first prior art, the shifter is greater in the aperture size than the non-shifter portion.

A difference of the aperture size between the shifter and the non-shifter portion is determined so that a difference in the pattern size is minimized. In the second prior art, the phase difference of the aperture between the shifter and the non-shifter portion is 180 degrees. The parameters and resultant values of DOF are shown in Table 1.

TABLE 1

| | First Conventional Method | Second Conventional Method | Present Invention |
|---|---|---|---|
| Pattern pitch on Wafer (μm) | 0.3 | 0.3 | 0.3 |
| Aperture Size of Deep Trench on Wafer (μm) | 0.169 | 0.150 | 0.138 |
| Aperture Size of Shallow Trench on Wafer (μm) | 0.150 | 0.150 | 0.138 |
| Trench depth of Deep Trench on Mask (nm) | 248 | 488 | 488 |
| Trench Depth of Shallow Trench on Mask (nm) | 0 | 248 | 248 |
| Numerical Aperture of Optical System NA | 0.6 | 0.6 | 0.6 |
| Coherence Factor σ | 0.3 | 0.3 | 0.3 |
| Obtained DOF (μm) | 0.99 | 0.88 | 1.15 |

Throughout the figures, the horizontal axis represents the irradiation of exposure light (log) and the vertical axis is the defocus location. The area defined by the real line produces less than ±10% of the variation of the desired pattern size at the deep trench. The area defined by the broken line generates less than ±10% of the variation of the desired pattern size at the shallow trench.

As apparent, the allowable focusing variation, denoted at DOF, when the likelihood of the irradiation of exposure light is 10% as expressed by the vertical length of a rectangular window in the ED diagram is 0.99 μm in the first prior art and 0.88 μm in the second prior art, but in the present invention as high as 1.15 μm.

Figure 3:
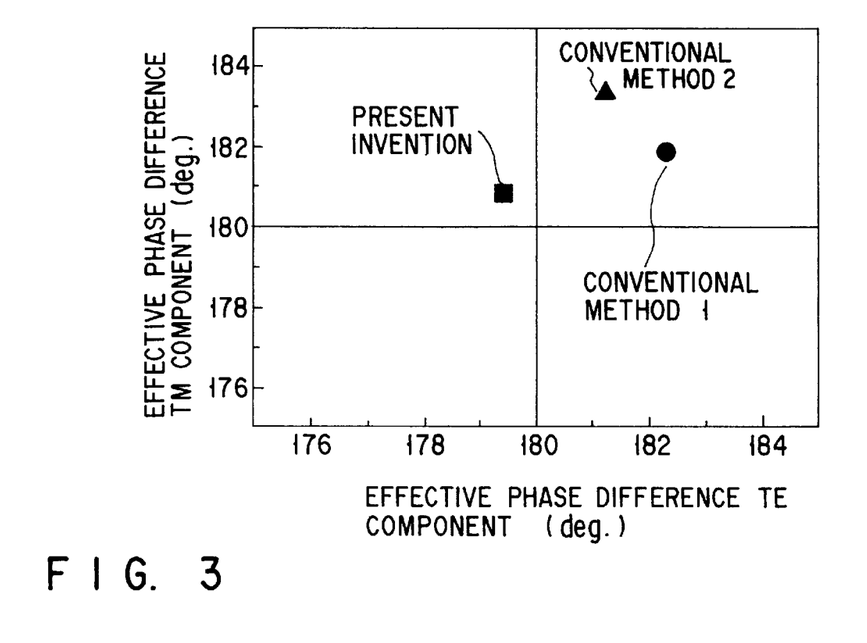
FIG. 3 is a diagram showing the results of effective phase difference with the Levenson masks of the present invention and the prior arts.

FIG. 3 shows three results of effective phase difference of the two prior arts and the present invention given from two separate values; a component parallel to and a component vertical to the L&S pattern. The effective phase difference is a parameter explained in the first prior art which is a difference of phase on the ideal mask having no effect of mask topography as estimated from the amplitude and phase of 0-degree and ±1-degree lights determined by Fourier transformation of electric field profiles of the mask.

As apparent from FIG. 3, both TE and TM components of the present invention are closer to 180 degrees than those of the prior arts showing a favorable form of the Levenson mask. The advantage of the present invention is obtained by calculating the optimum values of the depth and size of both the deep and shallow apertures and approximating TE and TM to 180 degrees of the phase.

The first prior art allows the aperture size to be adjusted without concerning the depth of the aperture trench hence failing to determine an optimum value of the depth. The second prior art permits adjustment of the depth of the aperture trench thus failing to have an optimum value of the bias. The present invention has both the depth and bias of the aperture determined simultaneously whereby the exposure characteristics of the Levenson mask will be optimized.

As set forth above, the present invention allows both the difference between the aperture pattern size and its adjacent light shielding pattern size and the depth of the trench in the aperture pattern to be determined from the sum of the aperture pattern size and its adjacent light shielding pattern size. Accordingly, the generation of a size variation attributed to the 3-dimensional structure of an exposure mask will be minimized and the production of such an exposure mask will be facilitated.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

Embodiments of the present invention will be described referring to the accompanying drawings.

Figure 4:
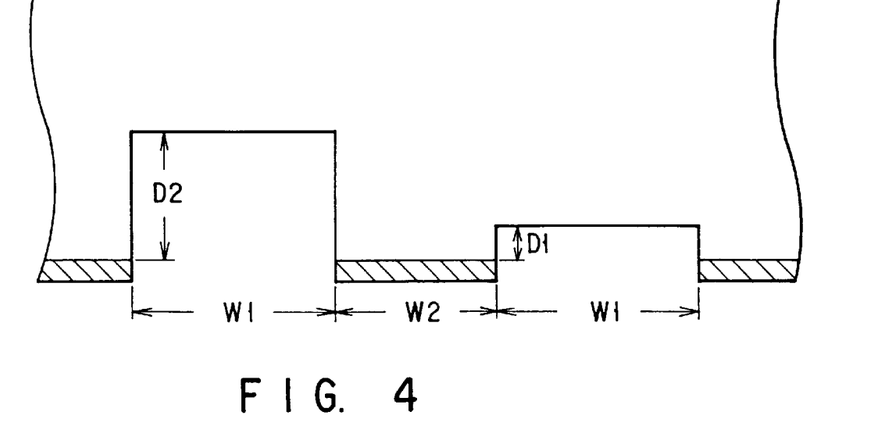
FIG. 4 is an enlarged cross sectional view of an exposure mask according to the present invention.

FIG. 4 illustrates the depth of trenches and the size of apertures in a Levenson mask. As shown, the pattern size of each aperture is denoted by $W_1$, the pattern size of a shielding portion $W_2$, the depth of a shallow trench $D_1$, and the depth of a deep trench $D_2$. The ratio of the aperture pattern size to a sum of the aperture pattern size and the shielding pattern size is $W_1/(W_1+W_2)$. In the embodiments, the bias is expressed by $\Delta W$. It is assumed that $\Delta W$ is $(W_1-W_2)/2$ as is a converted value on a wafer.

(Embodiment 1)

This Embodiment concerns a Levenson type phase shifting mask for exposure to 248 nm of light. More specifically, the exposure mask is designed to have an optimum solution from dynamic parameters of $\Delta W$, $D_1$, and $D_2$ determined for a desired L&S pattern of 0.18 μm size (the dimensional ratio being 1:1). It is assumed that the numerical aperture (NA) of an optical projection system to be used is 0.6, the coherence factor (σ) 0.3, and the ratio of reduction of an exposure apparatus ¼. The optimum values of $\Delta W$, $D_1$, and $D_2$ are evaluated on the basis of the reference of DOF given by simulation.

The reference DOF is obtained from the following steps.

(1) The intensity of exposure light and the defocusing area under which the line width varies less than ±10% of a desired value are determined from profiles of light intensity projected through the deep and shallow trenches respectively.

(2) The DOF is calculated as a permissive focusing variation in a common area of the deep and shallow trenches when the likelihood of the exposure intensity is up to 10%.

Accordingly, the optimum resolution is obtained when $(\Delta W, D_1, D_2)=(0.02 \mu m, 248 nm, 488.3 nm)$.

Based on the above simulation, a pattern data of apertures for making the 0.18 μm printing pattern was produced with the bias of 0.02 μm (on wafer). Then, the pattern data was converted to a plotting data which was used for plotting the pattern with an electron beam. After etching process, a light shielding pattern was completed. The light shielding pattern appeared $\Delta W=0.021$ μm as measured by an optical microscope.

A resist pattern was produced for covering the apertures of shallow trench. The apertures of deep trench were further etched by a depth of 245 nm which was slightly greater than $D_2-D_1$. After removing the resist pattern, the mask was subjected to final etching for having the deep trenches and the shallow trenches where $D_1$=248 nm. As the result, it was found that the finished exposure mask provides $(\Delta W, D_1, D_2)=(0.021 \mu m, 247.7 nm, 487.8 nm)$ which are substantially equal to those parameters of the prescribed simulation.

The reason why the deep trench regions are etched to a depth slightly greater than the expected value at the first etching process is that the etching speed in the deep trench regions is slowed down at the second etching process as compared with the shallow trench regions. When $D_1$=247.7 nm is achieved, the deep trench regions are etched by a less depth. It is more effective that the etching process is controlled with compensation of etching depth since the actual etching speed is varied depending on the depth of preformed trenches.

The resultant exposure mask was then examined for the characteristics of exposure. Under the same exposure conditions as of the simulation, an optical image was projected through the mask and measured. The result of DOF was substantially equal to that of the ideal mask which has no effect of mask topography.

Although the wavelength λ of exposure light in this Embodiment is 248 nm, it may be 193 nm, 365 nm, or 436 nm with equal effectiveness. The other conditions including NA and coherence factor will also be varied so long as the pattern is successfully focused. For more alteration, $\Delta W, D_1$, and $D_2$ may be normalized with the wavelength.

The Embodiment is not limited to the L&S pattern of 0.18 μm size (at the dimensional ratio of 1:1) but any other size or ratio of the pattern will be used with equal success. Also, the reduction ratio of the exposure apparatus may be changed as desired.

(Embodiment 2)

Figure 5:
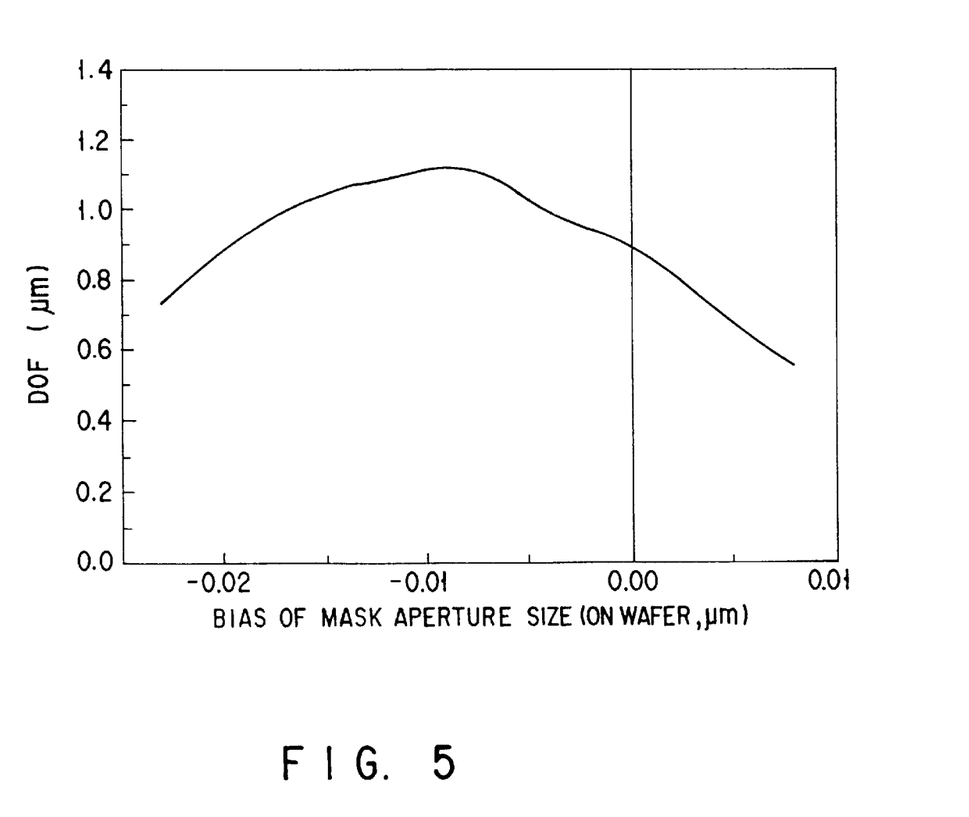
FIG. 5 is a diagram showing DOF in relation to the bias.

This Embodiment concerns a Levenson type phase shifting mask for exposure to 193 nm of light. More particularly, the optimum value of $\Delta W$ related to $D_1$ and $D_2$ for a desired L&S pattern of 0.15 μm size (at the dimensional ratio of 1:1) are calculated and used for making the phase shifting mask. It is assumed that the numerical aperture (NA) of an optical projection system to be used is 0.5, the coherence factor (σ) 0.3, and the ratio of reduction of an exposure apparatus ¼. The relation between $\Delta W$ and DOF with $D_1$=181.0 nm and $D_2$=367.9 nm is shown in FIG. 5. The DOF is calculated by the manner described in Embodiment 1.

As apparent from FIG. 5, $\Delta W$=−0.0115 μm (on the wafer) leads to the optimum solution when the depths $D_1$ and $D_2$ are fixed. This means that the optimum value of $(W_1-W_2)$ is determined from $D_1, D_2$, and a sum of the aperture pattern size and the shield pattern size $(W_1+W_2)$, namely 0.3 μm in this Embodiment).

Based on the simulation, a pattern data of apertures for making the 0.15 μm printing pattern was produced with the bias of −0.0115 μm (on wafer). Then, the pattern data was converted to a plotting data which was used for plotting the pattern with an electron beam. After etching process, a light shielding pattern was completed. The light shielding pattern appeared $\Delta W$=−0.0116 μm as measured by an optical microscope.

A resist pattern was produced for covering the apertures of shallow trench. The apertures of deep trench were further etched by a depth of 190 nm which was slightly greater than $D_2-D_1$. After removing the resist pattern, the mask was subjected to final etching for having the deep trenches and the shallow trenches where $D_1$=181 nm. As the result, it was found that the finished exposure mask provides $(\Delta W, D_1, D_2)=(-0.0116 \mu m, 181.2 nm, 368 nm)$ which are substantially equal to those parameters of the prescribed simulation.

The reason why the deep trench regions are etched to a depth slightly greater than the expected value at the first etching process is that the etching speed in the deep trench regions is slowed down at the second etching process as compared with the shallow trench regions. When $D_1$=181.2 nm is gained, the deep trench regions are etched by a less depth. It is more effective that the etching process is controlled with compensation of etching depth since the actual etching speed is varied depending on the depth of preformed trenches.

The exposure through the exposure mask was carried out under the same conditions as of the simulation, and its resultant DOF of a negative resist pattern on a processed substrate was found favorable. The DOF is 23% higher than that with the bias not optimized ($\Delta W$=0).

The wavelength λ of exposure light in this Embodiment is not limited to 193 nm but may be 248 nm, 365 nm, or 436 nm with equal effectiveness. The other conditions including NA and coherence factor will also be varied so long as the pattern is successfully focused. More alteration is possible having $\Delta W, D_1$, and $D_2$ normalized with the wavelength.

The Embodiment is not limited to the L&S pattern of 0.15 μm size (at the dimensional ratio of 1:1) but any other size or ratio of the pattern will be used with equal success. Also, the reduction ratio of the exposure apparatus may be changed as desired.

(Embodiment 3)

Figure 6:
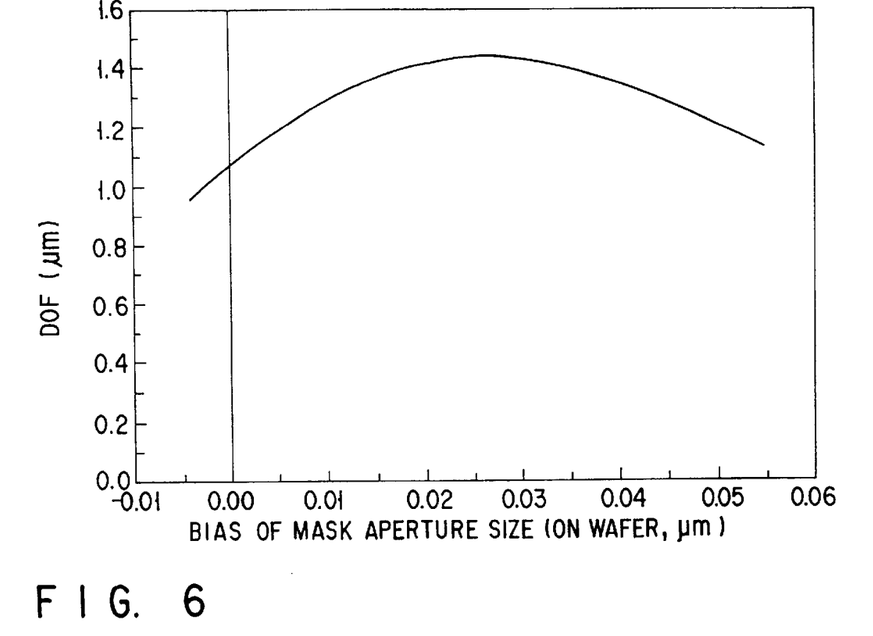
FIG. 6 is another diagram showing DOF in relation to the bias.

This Embodiment concerns a Levenson type phase shifting mask for exposure to 248 nm of light. More particularly, the optimum value of $\Delta W$ related to $D_1$ and $D_2$ for a desired L&S pattern of 0.18 μm size (at the dimensional ratio of 1:1) are calculated and used for making the phase shifting mask. It is assumed that the numerical aperture (NA) of an optical projection system to be used is 0.57, the coherence factor (σ) 0.4, and the ratio of reduction of an exposure apparatus ¼. The relation between $\Delta W$ and DOF with $D_1$=248 nm and $D_2$=488.3 nm is shown in FIG. 6. The DOF is calculated by the manner described in Embodiment 1.

As apparent from FIG. 6, $\Delta W$=0.02 μm (on the wafer) leads to the optimum solution when the depths $D_1$ and $D_2$ are fixed. This means that the optimum value of $(W_1-W_2)$ is determined from $D_1, D_2$, and a sum of the aperture pattern size and the shield pattern size $(W_1+W_2)$, namely 0.36 μm in this Embodiment).

Based on the simulation, a pattern data of apertures for making the 0.18 μm printing pattern was produced with the bias of 0.02 μm (on wafer). Then, the pattern data was converted to a plotting data which was used for plotting the pattern with an electron beam. After etching process, a light shielding pattern was completed. The light shielding pattern appeared A W=0.02 μm as measured by an optical microscope.

A resist pattern was produced for covering the apertures of shallow trench. The apertures of deep trench were further etched by a depth of 245 nm which was slightly greater than $D_2-D_1$. After removing the resist pattern, the mask was subjected to final etching for having the deep trenches and the shallow trenches where $D_1=248$ nm. As the result, it was found that the finished exposure mask provides ($\Delta W$, $D_1$, $D_2$)=(0.022 μm, 248.1 nm, 488.5 nm) which are substantially equal to those parameters of the prescribed simulation.

The reason why the deep trench regions are etched to a depth slightly greater than the expected value at the first etching process is that the etching speed in the deep trench regions is slowed down at the second etching process as compared with the shallow trench regions. When $D_1=248.1$ nm is gained, the deep trench regions are etched by a less depth. It is more effective that the etching process is controlled with compensation of etching depth since the actual etching speed is varied depending on the depth of preformed trenches.

The exposure with the exposure mask was carried out under the same conditions as of the simulation, and its resultant DOF of a negative resist pattern on a processed substrate was found favorable. The DOF is 35% higher than that with the bias not optimized ($\Delta W=0$).

The wavelength λ of exposure light in this Embodiment is not limited to 248 nm but may be 193 nm, 365 nm, or 436 nm with equal effectiveness. The other conditions including NA and coherence factor will also be varied so long as the pattern is successfully focused. More alteration is possible having $\Delta W$, $D_1$, and $D_2$ normalized with the wavelength.

The Embodiment is not limited to the L&S pattern of 0.18 μm size (at the dimensional ratio of 1:1) but any other size or ratio of the pattern will be used with equal success. Also, the reduction ratio of the exposure apparatus may be changed as desired.

(Embodiment 4)

Figure 7:
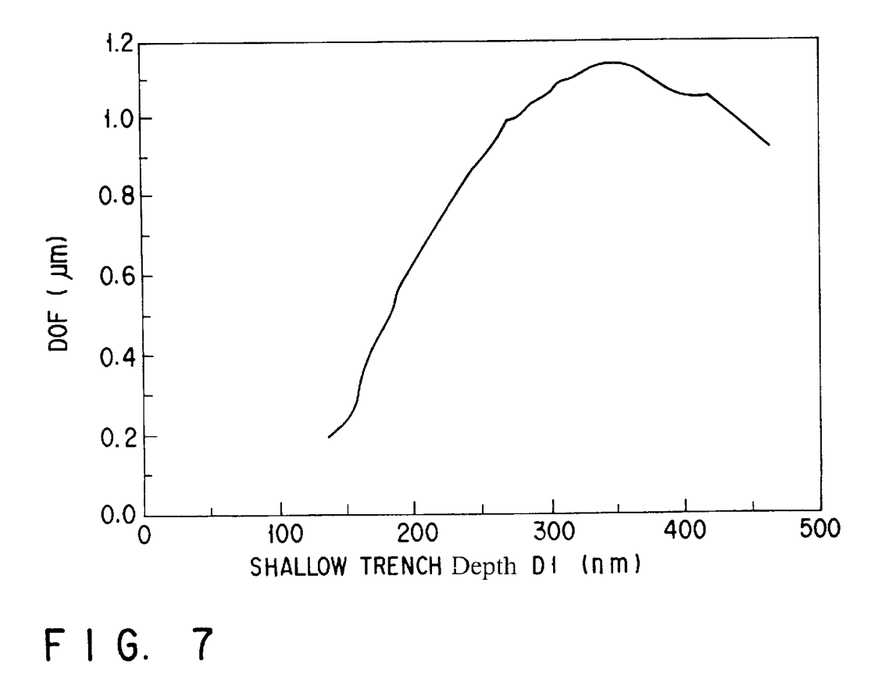
FIG. 7 is a diagram showing DOF in relation to the depth $D_1$ of an etched trench.

This Embodiment concerns a Levenson type phase shifting mask for exposure to 248 nm of light. More particularly, the optimum value of $D_1$ with $D_2-D_1$ and $\Delta W$ maintained constant for a desired L&S pattern of 0.15 μm size (at the dimensional ratio of 1:1) are calculated and used for making the phase shifting mask. It is assumed that the numerical aperture (NA) of an optical projection system to be used is 0.6, the coherence factor (σ) 0.3, and the ratio of reduction of an exposure apparatus ¼. The relation between $D_1$ and DOF with $D_2-D_1=240$ nm and $\Delta W=0$ μm is shown in FIG. 7. The DOF is calculated by the manner described in Embodiment 1.

As apparent from FIG. 7, $D_1=385.8$ μm (on the wafer) leads to the optimum solution when $D_2-D_1$ and $\Delta W$ are fixed. This means that the optimum values of $D_1$ and $D_2$ are determined from a sum of the aperture pattern size and the shield pattern size ($W_1+W_2$, namely 0.3 μm in this Embodiment) and a difference between the same ($W_1-W_2$, namely 0 in this Embodiment).

Based on the simulation, a pattern data of apertures was produced without the use of a bias. Then, the pattern data was converted to a plotting data which was used for plotting the pattern with an electron beam. After etching process, a light shielding pattern was completed. The light shielding pattern appeared $\Delta W=0.001$ μm as measured by an optical microscope.

A resist pattern was produced for covering the apertures of shallow trench. The apertures of deep trench were further etched by a depth of 248 nm which was slightly greater than $D_2-D_1$. After removing the resist pattern, the mask was subjected to final etching for having the deep trenches and the shallow trenches where $D_1=385.8$ nm. As the result, it was found that the finished exposure mask provides ($\Delta W$, $D_1$, $D_2$)=(0.001 μm, 386.0 nm, 626.0 nm) which are substantially equal to those parameters of the prescribed simulation.

The reason why the deep trench regions are etched to a depth slightly greater than the expected value at the first etching process is that the etching speed in the deep trench regions is slowed down at the second etching process as compared with the shallow trench regions. When $D_1=386.0$ nm is gained, the deep trench regions are etched by a less depth. It is more effective that the etching process is controlled with compensation of etching depth since the actual etching speed is varied depending on the depth of preformed trenches.

The exposure with the exposure mask was carried out under the same conditions as of the simulation, and its resultant DOF of a negative resist pattern on a processed substrate was found favorable.

The wavelength λ of exposure light in this Embodiment is not limited to 248 nm but may be 193 nm, 365 nm, or 436 nm with equal effectiveness. The other conditions including NA and coherence factor will also be varied so long as the pattern is successfully focused. More alteration is possible having $\Delta W$, $D_1$, and $D_2$ normalized with the wavelength.

The Embodiment is not limited to the L&S pattern of 0.15 μm size (at the dimensional ratio of 1:1) but any other size or ratio of the pattern will be used with equal success. Also, the reduction ratio of the exposure apparatus may be changed as desired.

(Embodiment 5)

Figure 8:
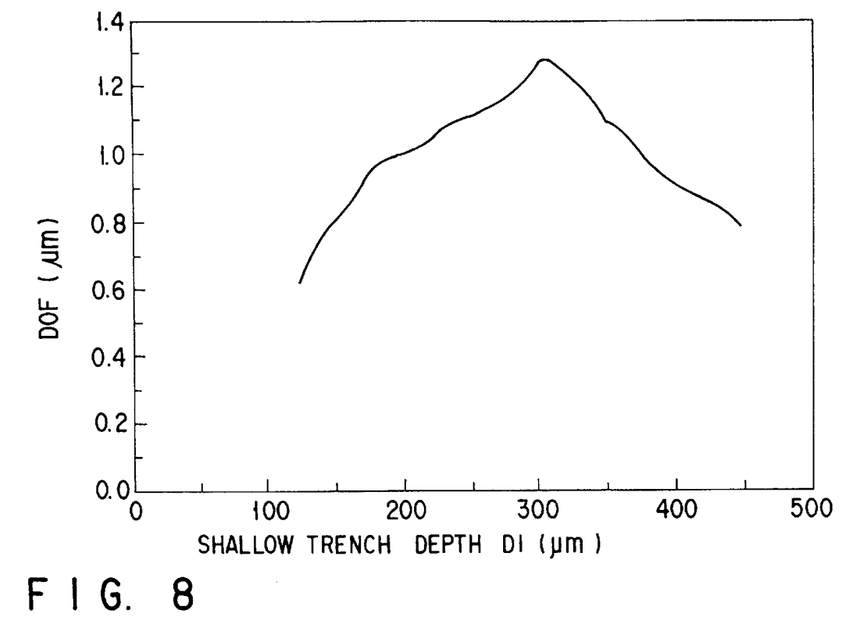
FIG. 8 is another diagram showing DOF in relation to the depth $D_1$ of an etched trench.

This Embodiment concerns a Levenson type phase shifting mask for exposure to 248 nm of light. More particularly, the optimum value of $D_1$ with $D_2-D_1$ and $\Delta W$ maintained constant for a desired L&S pattern of 0.18 μm size (at the dimensional ratio of 1:1) are calculated and used for making the phase shifting mask. It is assumed that the numerical aperture (NA) of an optical projection system to be used is 0.6, the coherence factor (σ) 0.3, and the ratio of reduction of an exposure apparatus ¼. The relation between $D_1$ and DOF with $D_2-D_1=240$ nm and $\Delta W=0$ μm is shown in FIG. 8. The DOF is calculated by the manner described in Embodiment 1.

As apparent from FIG. 8, $D_1=303.1$ μm (on the wafer) allows the optimum solution when $D_2-D_1$ and $\Delta W$ are fixed. This means that the optimum values of $D_1$ and $D_2$ are determined from a sum of the aperture pattern size and the shield pattern size ($W_1+W_2$, namely 0.36 μm in this Embodiment) and a difference between the same ($W_1-W_2$, namely 0 in this Embodiment).

Based on the simulation, a pattern data of apertures was produced without the use of a bias. Then, the pattern data was converted to a plotting data which was used for plotting the pattern with an electron beam. After etching process, a light shielding pattern was completed. The light shielding pattern appeared $\Delta W=-0.001$ μm as measured by an optical microscope.

A resist pattern was produced for covering the apertures of shallow trench. The apertures of deep trench were further etched by a depth of 247 nm which was slightly greater than $D_2-D_1$. After removing the resist pattern, the mask was subjected to final etching for having the deep trenches and the shallow trenches where $D_1=303.1$ nm. As the result, it was found that the finished exposure mask provides ($\Delta W$, $D_1$, $D_2$)=(-0.001 μm, 303.0 nm, 543.0 nm) which are substantially equal to those parameters of the prescribed simulation.

The reason why the deep trench regions are etched to a depth slightly greater than the expected value at the first etching process is that the etching speed in the deep trench regions is slowed down at the second etching process as compared with the shallow trench regions. When $D_1$=303.1 nm is achieved, the deep trench regions are etched by a less depth. It is more effective that the etching process is controlled with compensation of etching depth since the actual etching speed is varied depending on the depth of preformed trenches.

The exposure with the exposure mask was carried out under the same conditions as of the simulation, and its resultant DOF of a negative resist pattern on a processed substrate was found favorable.

The wavelength λ of exposure light in this Embodiment is not limited to 248 nm but may be 193 nm, 365 nm, or 436 nm with equal effectiveness. The other conditions including NA and coherence factor will also be varied so long as the pattern is successfully focused. More alteration is possible having $\Delta W$, $D_1$, and $D_2$ normalized with the wavelength.

The Embodiment is not limited to the L&S pattern of 0.18 μm size (at the dimensional ratio of 1:1) but any other size or ratio of the pattern will be used with equal success. Also, the reduction ratio of the exposure apparatus may be changed as desired.

(Embodiment 6)

FIGS. 9A to 9E illustrate steps of manufacturing an exposure mask according to the present invention.

Figure 9A:
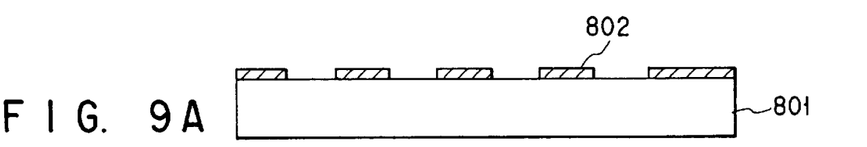
FIGS. 9A to 9E are views showing a procedure of producing the exposure mask of the present invention.

As shown in FIG. 9A, a light shielding pattern 802 was formed on a transparent substrate 801 which can transmit an exposure light. Then, measurements of the aperture pattern and shielding pattern were are determined from an optical image viewed by an optical microscope. It was found that $\Delta W$=−0.046 μm was given in the region where a sum of the aperture pattern size and the shielding pattern size was 1.2 μm. The depths $D_1$ and $D_2$ of trenches were calculated from simulation with various exposure conditions. If the exposure apparatus has a reduction ratio of ¼, NA=0.6, and coherence factor σ=0.3, the optimum values of $D_1$ and $D_2$ were 232.5 nm and 472.8 nm respectively.

Figure 9B:
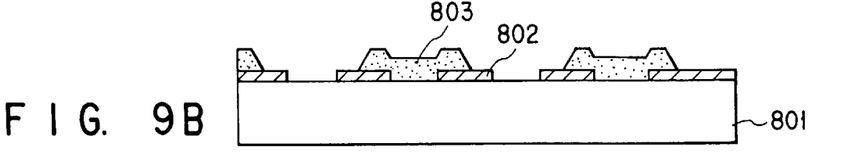
Figure 9C:
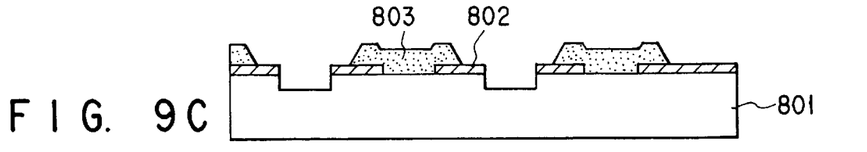
Figure 9D:
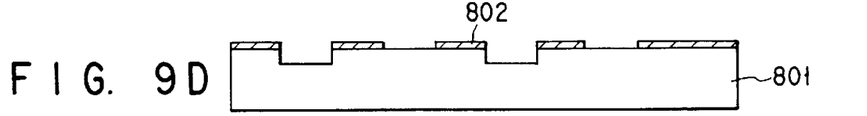
Figure 9E:
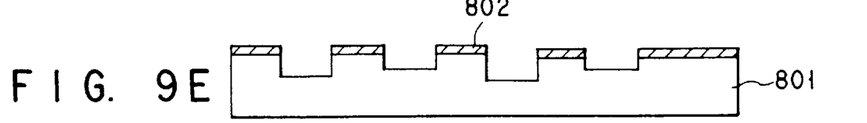

This was followed by forming a resist pattern 803 over the light shielding pattern 802 as shown in FIG. 9B. Then, the substrate 801 was vertically etched to 240.3 nm, which is equivalent to $D_1$−$D_2$, by an RIE (reactive ion etching) process, as shown in FIG. 9C. After the resist pattern 802 was removed as shown in FIG. 9D, the substrate 801 was further etched by $D_1$ using the RIE process as shown in FIG. 9E.

As the result, the finished exposure mask produces a 0.15 μm L&S pattern with 1.00 μm of DOF.

The depth of etching in this Embodiment is not of limitation and may be varied depending on the aperture pattern size, the printed pattern size, and other conditions. Although the measurement of the shielding pattern is conducted with the optical (laser) microscope in this Embodiment, it may be carried out using an electron microscope or any other appropriate device.

(Embodiment 7)

This Embodiment concerns a Levenson type phase shifting mask for exposure to 248 nm of light. More particularly, the exposure mask is designed to have an optimum solution from dynamic parameters of $\Delta W$, $D_1$, and $D_2$ for a desired L&S pattern of 0.15 μm size (at the dimensional ratio of 1:1). It is assumed that the numerical aperture (NA) of an optical projection system to be used is 0.6, the coherence factor (σ) 0.3, and the ratio of reduction of an exposure apparatus ¼. The values of $\Delta W$, $D_1$, and $D_2$ for optimum solution are determined from DOF given by simulation. The DOF is calculated by the manner described in Embodiment 1. As the result, the optimum solution is achieved when ($\Delta W$, $D_1$, $D_2$)=(−0.012 μm, 248 nm, 488.3 nm).

Based on the simulation, a pattern data of apertures for making the 0.15 μm printing pattern was produced with a bias of −0.012 μm (on wafer). Then, the pattern data was converted to a plotting data which was used for plotting the pattern with an electron beam. After etching process, a light shielding pattern was completed. When measured by an optical microscope, the light shielding pattern appeared $\Delta W$=0 μm which was far different from the original value determined in the preparation of the pattern data. After completion, DOF of the exposure mask was as low as 0.9 μm which was 0.2 μm smaller than 1.15 μm of the ideal mask.

It was then simulated to have the optimum values of $D_1$ and $D_2$ with $\Delta W$=0 μm. When ($D_1$, $D_2$)=(−0.012 μm, 612.3 nm), a resultant DOF was almost equal to the DOF value with ($\Delta W$, $D_1$, $D_2$)=(−0.012 μm, 248 nm, 488.3 nm). Then, a resist pattern was produced for covering the apertures of shallow trench. The apertures of deep trench were further etched.

After removing the resist pattern, the mask was subjected to final etching of both the deep trenches and the shallow trenches. As the result, it was found that the finished exposure mask provides ($\Delta W$, $D_1$, $D_2$)=(0 μm, 371.8 nm, 612.28 nm) which are substantially equal to those parameters of the second simulation.

The exposure mask was then examined for the characteristics of exposure. Under the same exposure conditions as of the simulation, an optical image was projected through the mask and measured. The result of DOF was substantially equal to that of the ideal mask which has no effect of mask topography.

As described, the optimum values of $D_1$ and $D_2$ are calculated in relation to a variable of $\Delta W$ and used for etching process. Accordingly, the resultant exposure mask will be fabricated having optimum exposure characteristics.

If the light shielding pattern is found greater in the size, it may be coated with a layer of resist pattern and etched again to have the desired size.

Preferably, when the resist pattern has been coated, it is exposed to light from the back side. As the result, a selectively modified resist pattern remains over the light shielding pattern and is used as an etching mask for further etching process.

Although the wavelength of exposure light in this Embodiment is 248 nm, it may be 193 nm, 365 nm, or 436 nm with equal effectiveness. The other conditions including NA and coherence factor will also be varied so long as the pattern is successfully focused. For more alternation, $\Delta W$, $D_1$, and $D_2$ may be normalized with the wavelength.

The Embodiment is not limited to the L&S pattern of 0.15 μm size (at the dimensional ratio of 1:1) but any other size or ratio of the pattern will be used with equal success. Also, the reduction ratio of the exposure apparatus may be changed as desired.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An exposure mask comprising:
   a transparent substrate having a light shielding pattern and an aperture pattern thereon for transmitting exposure light;
   wherein said transparent substrate is arranged such that two adjacent apertures of the aperture pattern having a same aperture pattern width W1 have respective first and second trenches having first and second depths of D1 and D2, respectively, the second depth D2 being deeper than the first depth D1; and a difference between the aperture pattern width W1 and an adjacent light shielding pattern width W2, and the first and second depths D1 and D2 are calculated as an optimal solution in a simulation method to make a value of a depth of focus a maximum when a sum of the aperture pattern width and the adjacent light shielding pattern width W2, which is determined by a design rule, is given.

2. The exposure mask according to claim 1, wherein at least one of the second depth D2 and a difference between the first depth $D_1$ and the second depth D2 is calculated to make a value of a depth of focus a maximum when the aperture pattern width W1 is given.

3. The exposure mask according to claim 1, wherein at least one of the second depth D2 and a difference between the first depth D1 and the second depth D2 is calculated to make a value of a depth of focus a maximum ratio W1/(W1+W2) of the aperture pattern width W1 to the sum of the aperture pattern width W1 and the adjacent light shielding pattern width W2 is given.

4. The exposure mask according to any of claims 2 or 3, wherein the first depth ($D_1$) and the second depth ($D_2$) are expressed by:

$$|D_1-D_2|=m_1\lambda/(2n-1)-\delta_1,$$

$$9\lambda/16(n-1)+m_2\lambda/(n-1)\leq D_1, \text{ and}$$

$$D_1 \leq \lambda/(n-1)+m_2\lambda/(n-1),$$

where n is an index of refraction of the transparent substrate, $\lambda$ is a wavelength of the exposure light, $m_1$ and $m_2$ are integers equal to or greater than 1, and $\delta_1$, is defined by an equation $|\delta_1|<\lambda/16(n-1)$.

5. The exposure mask according to claim 1, wherein an edge of the light shielding pattern corresponds to an edge of the transparent substrate.

6. The exposure mask according to claim 1, wherein the difference between the aperture pattern width W1 and the adjacent light shielding pattern width W1 and the first and second depths D1 and D2 are calculated by using a coherence factor during exposure, a complex index of refraction of the transparent substrate at a wavelength of the exposure light, and a complex index of refraction of the light shielding pattern at the wavelength of the exposure light as an initial condition when the sum of the aperture pattern width W1 and the adjacent light shielding pattern width W2 is given.

7. An exposure mask comprising:

a transparent substrate having a light shielding pattern and an aperture pattern thereon for transmitting exposure light;

wherein said transparent substrate is arranged such that two adjacent apertures of the aperture pattern having a same aperture pattern width W1 have respective first and second trenches having first and second depths of D1 and D2, respectively, the second depth D2 being deeper than the first depth D1; and a difference between the aperture pattern width W1 and an adjacent light shielding pattern width W2 are calculated as an optimal solution in a simulation method to make a value of a depth of focus a maximum when a sum of the aperture pattern width W1 and the adjacent light shielding pattern width W2, which is determined by a design rule, is given.

8. An exposure mask comprising:

a transparent substrate having a light shielding pattern and an aperture pattern thereon for transmitting exposure light;

wherein said transparent substrate is arranged such that two adjacent apertures of the aperture pattern having a same aperture pattern width W1 have respective first and second trenches having first and second depths of D1 and D2, respectively, the second depth D2 being deeper than the first depth D1; and the first and second trench depths D1 and D2 are calculated as an optimal solution in a simulation method to make a value of a depth of focus a maximum when a difference between the aperture pattern width W1 and an adjacent light shielding pattern width W2, and a sum of the aperture pattern width W1 and the adjacent light shielding pattern width W2, which is determined by a design rule, are given.

9. A method of manufacturing an exposure mask comprising:

a first step of forming a light shielding pattern and an aperture pattern defining apertures on a transparent substrate for transmitting an exposure light;

a second step of measuring the aperture pattern width W1 and a light shielding pattern width W2;

a third step of calculating depths D1 and D2 of trenches in the aperture pattern as an optimal solution in a simulation method to make a value of a depth of focus a maximum based on a sum of the aperture pattern width W1 and the adjacent light shielding pattern width W2 measured in the second step; and a fourth step of etching the aperture pattern in the transparent substrate to have trenches of the calculated depths D1 and D2.

10. The method of manufacturing an exposure mask according to claim 9, wherein the fourth step includes forming the trenches by anisotropic etching.

11. The method of manufacturing an exposure mask according to claim 9, wherein the second step includes measuring at least one of the aperture pattern width and the light shielding pattern width with an optical or electron-beam means.

12. The method of manufacturing an exposure mask according to claim 11, wherein the fourth step includes forming the trenches by anisotropic etching.

13. The method of manufacturing an exposure mask according to claim 9, wherein the third step includes calculating the depth so that focal points of images of respective apertures thereof are identical in a simulation concerning an effect of mask topography.

14. The method of manufacturing an exposure mask according to claim 13, wherein the fourth step includes forming the trenches by anisotropic etching.

15. The method of manufacturing an exposure mask according to claim 13, wherein the anisotropic etching is implemented by a reactive ion etching (RIE).

16. The method of manufacturing an exposure mask according to claim 9, wherein the third step includes calculating the depth so that intensities of illumination of images of respective apertures thereof at a focal point are identical in a simulation concerning an effect of mask topography.

17. The method of manufacturing an exposure mask according to claim 16, wherein the fourth step includes forming the trenches by anisotropic etching.

* * * * *